United States Patent
Kamiyama et al.

(10) Patent No.: US 7,417,360 B2
(45) Date of Patent: Aug. 26, 2008

(54) PIEZOELECTRIC RESONATOR AND METHOD FOR PRODUCING THE SAME

(75) Inventors: Tomohide Kamiyama, Osaka (JP); Keiji Onishi, Osaka (JP); Hiroshi Nakatsuka, Osaka (JP); Takehiko Yamakawa, Osaka (JP); Tomohiro Iwasaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/580,032

(22) Filed: Oct. 13, 2006

(65) Prior Publication Data
US 2007/0090725 A1      Apr. 26, 2007

(30) Foreign Application Priority Data
Oct. 20, 2005    (JP) .............................. 2005-305485

(51) Int. Cl.
*H01L 41/053*    (2006.01)
(52) U.S. Cl. ...................................................... 310/348
(58) Field of Classification Search ................ 310/320, 310/321, 324, 348, 349, 352–354
See application file for complete search history.

(56) References Cited

U.S. PATENT DOCUMENTS 4,266,157 A  *  5/1981  Peters .......................... 310/353
4,450,377 A  *  5/1984  Briese .......................... 310/348
4,748,367 A  *  5/1988  Bloch et al. .................. 310/343
6,737,940 B2 *  5/2004  Takeuchi et al. ............. 333/189
7,276,840 B2 * 10/2007  Nishiwaki .................... 310/348
2004/0021402 A1*  2/2004  Morley et al. ................ 310/348
2005/0012571 A1*  1/2005  Song et al. ................... 333/192

FOREIGN PATENT DOCUMENTS

JP            1-233493     *   3/1988    ................. 310/324
JP         2002-374144        12/2002
JP          2003-32060         1/2003

* cited by examiner

*Primary Examiner*—Thomas M Dougherty
(74) *Attorney, Agent, or Firm*—Wenderoth, Lind & Ponack, L.L.P.

(57) ABSTRACT

An upper electrode is provided on one main surface of a piezoelectric layer, and a lower electrode is provided on the other main surface thereof. A vibration section is an area in which the lower electrode, the piezoelectric layer and the upper electrode overlap in a vertical projection direction. Line electrodes for respectively connecting the lower electrode and the upper electrode to input/output electrodes are provided on the one main surface and the other main surface of the piezoelectric layer. The vibration section is placed on (connected to) the substrate via the support section. The support section is provided on an area of the piezoelectric layer excluding the area on which the vibration section is provided and the area on which the input/output electrodes and the line electrodes are provided.

10 Claims, 9 Drawing Sheets

(STEP g)

(STEP h)

(STEP i)

(STEP j)

PIEZOELECTRIC RESONATOR AND METHOD FOR PRODUCING THE SAME

BACKGROUND OF THE INVENTION

1. Field of the Invention

The present invention relates to a piezoelectric resonator, using a piezoelectric thin film, usable for wireless communication apparatuses represented by, for example, mobile phones and wireless LAN apparatuses, and a method for producing such a piezoelectric resonator.

2. Description of the Background Art

Components built in mobile communication apparatuses or the like are demanded to be more compact and more lightweight while having high performance. For example, filters or duplexers used in mobile phones for selecting RF signals are demanded to be compact and small in insertion loss. One known filter for fulfilling such demands is a filter including a piezoelectric resonator using a piezoelectric thin film. See, for example, Japanese Laid-Open Patent Publication No. 2002-374144.

Figure 8A:
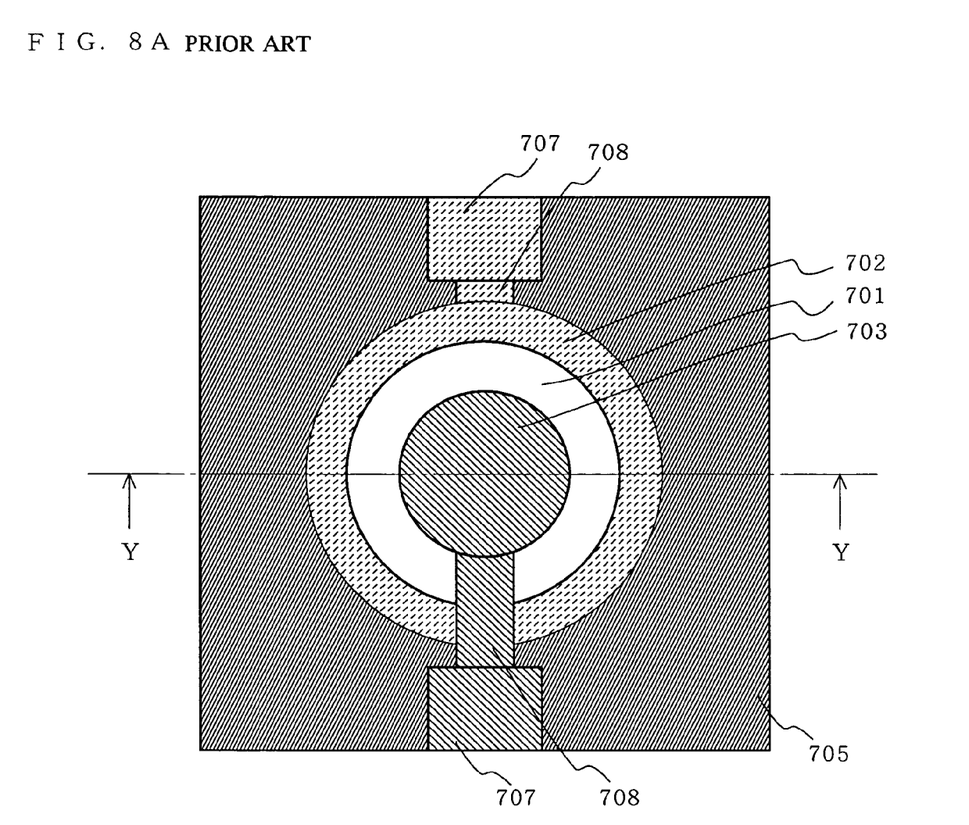
FIG. 8A and FIG. 8B schematically show a structure of a conventional piezoelectric resonator.
Figure 8B:
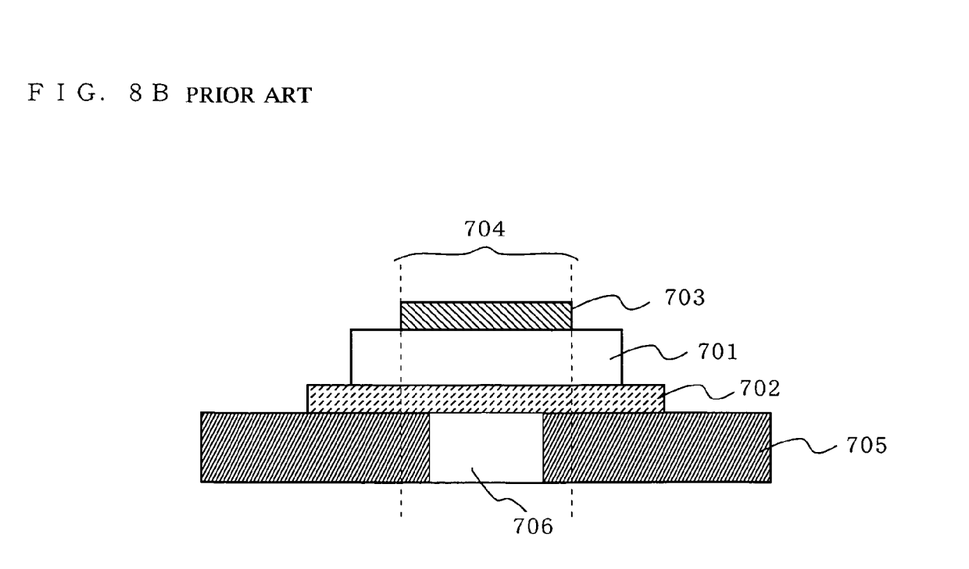

FIG. 8A is a plan view schematically showing a structure of a conventional piezoelectric resonator. FIG. 8B is a cross-sectional view of the conventional piezoelectric resonator shown in FIG. 8A taken along line Y-Y in FIG. 8A.

The conventional piezoelectric resonator includes a substrate 705, a lower electrode 702 provided on the substrate 705, a piezoelectric layer 701 provided on the lower electrode 702, and an upper electrode 703 provided on the piezoelectric layer 701. An area in which the lower electrode 702, the piezoelectric layer 701 and the upper electrode 703 overlap in a vertical projection direction acts as a vibration section 704. In the substrate 705, a cavity 706 for guaranteeing the vibration of the vibration section 704 is formed. The vibration section 704 is positioned on the substrate 705 so as to cover the cavity 706. Owing to such a structure, a part of the lower electrode 702 and/or the piezoelectric layer 701 which is not included in the vibration section 704 acts as a support section for supporting the piezoelectric resonator on the substrate 705. In an actual product, line electrodes 708 are provided for respectively connecting the lower electrode 702 and the upper electrode 703 to input/output electrodes 707.

The conventional piezoelectric resonator having such a structure is produced as follows.

First, the lower electrode 702, the piezoelectric layer 701, and the upper electrode 703 are sequentially formed on the substrate 705 by vapor deposition or sputtering. Next, the upper electrode 703, the piezoelectric layer 701 and the lower electrode 702 are patterned into a desired shape by photolithography. In the case where the input/output electrodes 707 and the line electrodes 708 are formed of the same material as that of the lower electrode 702 and the upper electrode 703, the input/output electrodes 707 and the line electrodes 708 are formed at the time of the patterning. Finally, the cavity 706 is formed by dry etching or the like performed from a surface of the substrate 705 on which the above-mentioned elements are not provided.

The piezoelectric resonator having such a structure operates as follows. An electric field is applied between the lower electrode 702 and the upper electrode 703 to mechanically distort the piezoelectric layer 701. The distortion is converted into an electric signal. Thus, the piezoelectric resonator acts as a resonator. There are a great number of vibration modes by the piezoelectric layer 701, but a thickness longitudinal mode having a high resonance frequency is used for wireless communication apparatuses represented by, for example, mobile phones and wireless LAN apparatuses.

As is well known, when a piezoelectric resonator is in a free vibration state in which the vibration section is floating in the air, the Q value which represents the resonance sharpness, and $\Delta f$ which is the difference between the resonance frequency and the anti-resonance frequency, are optimum. However, it is impossible to produce a vibration section which is physically floating in the air, and a support section is indispensable.

In the above-described conventional piezoelectric resonator, a part of the lower electrode 702 is in contact with the substrate 705 acting as a support section. Therefore, there is a problem that the vibration of the vibration section 704 leaks to the substrate 705 and thus the frequency characteristic is deteriorated. Even in a structure in which a part of the lower electrode 702 is not in contact with the substrate 705, the line electrode 708 is in contact with the substrate 705. Therefore, there is also the problem that the vibration of the vibration section 704 leaks to the substrate 705 and thus the frequency characteristic is deteriorated.

SUMMARY OF THE INVENTION

Therefore, an object of the present invention is to provide a piezoelectric resonator for suppressing the vibration of a vibration section from leaking through a support section and thus providing a superb frequency characteristic and a method for producing such a piezoelectric resonator.

The present invention is directed to a piezoelectric resonator vibrating at a predetermined frequency. In order to attain the object mentioned above, the piezoelectric resonator according to the present invention comprises a piezoelectric layer formed of a piezoelectric thin film; an upper electrode provided on one main surface of the piezoelectric layer; a lower electrode provided on the other main surface of the piezoelectric layer; a substrate; and a support section provided between the piezoelectric layer and the substrate. The support section is provided at a position which does not overlap the lower electrode or the upper electrode in a vertical projection direction.

The support section may include a plurality of support columns. It is preferable that support section is provided in such a shape and at such a position that the support section is non-rotation-symmetrical with respect to the center of vibration, or in such a shape and at such a position that the support section is non-line-symmetrical with respect to a straight line passing through the center of vibration. In addition, it is preferable that the support section is provided at a position at which the maximum straight distance to the lower electrode is larger than the maximum straight distance between an outer circumferential edge of the upper electrode and an outer circumferential edge of the lower electrode. The support section is formed of a conductive material.

The piezoelectric resonator having the above-described structure is produced by the steps of forming a piezoelectric layer on a first substrate; forming a lower electrode on one main surface of the piezoelectric layer; forming a first support layer on an area of the one main surface of the piezoelectric layer excluding the area on which the lower electrode is formed; forming a second support layer on a second substrate; bonding the first support layer and the second support layer together; separating the first substrate after the step of bonding, thereby transferring the piezoelectric layer having the lower electrode formed thereon from the first substrate to the second substrate; and forming an upper electrode on the other main surface of the piezoelectric layer such that upper electrode does not overlap the first support layer or the second support layer in a vertical projection direction.

Typically, the step of bonding is performed by eutectic crystallization bonding of the first support layer and the second support layer. In this case, the first support layer and the second support layer are preferably multi-layer films containing at least gold tin (AuSn) or gold silicon (AuSi).

The above-described piezoelectric resonator acts independently, or alternatively may be provided in a piezoelectric filter, a duplexer or a communication apparatus including a plurality of piezoelectric resonators.

According to the present invention, the vibration section and the support section do not contact each other. Therefore, the Q value and Δf of the piezoelectric resonator are improved as compared to those of conventional piezoelectric resonators. As a result, a filter and a duplexer having small-loss, wide-range and steep passband characteristics, and a high quality communication apparatus with low power consumption and low noise can be realized.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the present invention will be described by way of embodiments with reference to the drawings.

(Structure of a Piezoelectric Resonator)

Figure 1A:
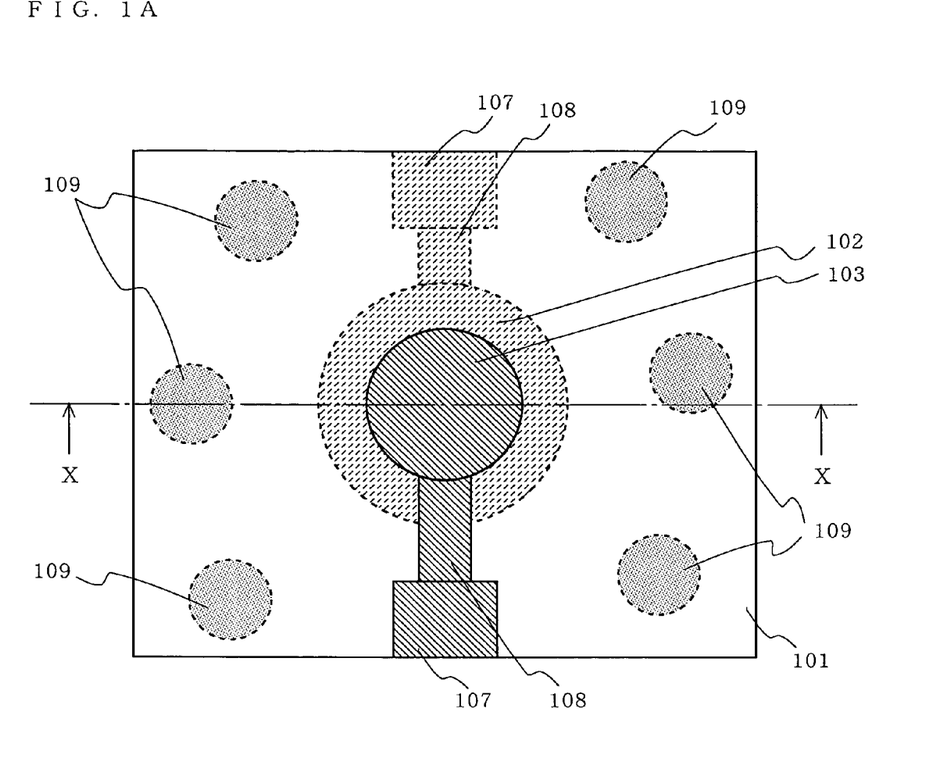
FIG. 1A and FIG. 1B schematically show a structure of a piezoelectric resonator according to one embodiment of the present invention.
Figure 1B:
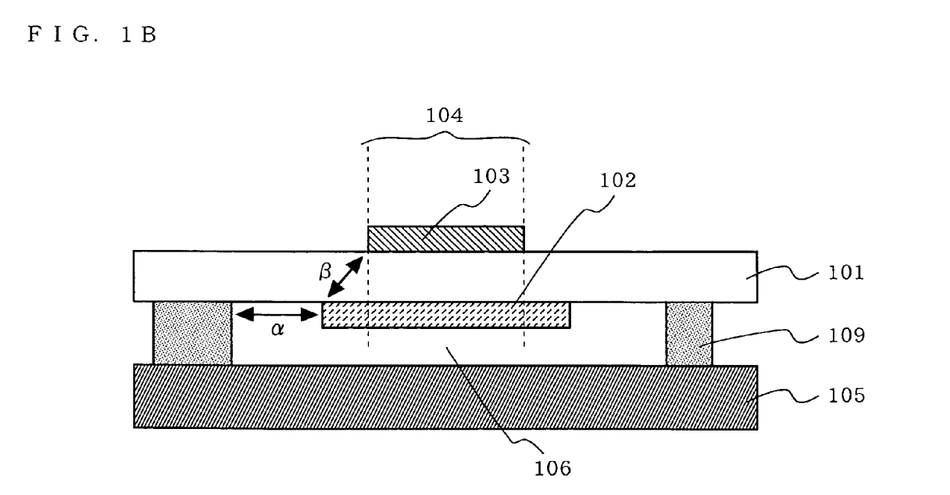

FIG. 1A is a plan view schematically showing a structure of a piezoelectric resonator according to an embodiment of the present invention. FIG. 1B is a cross-sectional view of the piezoelectric resonator shown in FIG. 1A taken along line X-X in FIG. 1A. The piezoelectric resonator according to this embodiment has the following structure.

An upper electrode 103 is provided on one main surface of a piezoelectric layer 101, and a lower electrode 102 is provided on the other main surface of the piezoelectric layer 101. A vibration section 104 is an area in which the lower electrode 102, the piezoelectric layer 101 and the upper electrode 103 overlap in a vertical projection direction. Line electrodes 108 for respectively connecting the lower electrode 102 and the upper electrode 103 to input/output electrodes 107 are provided on one main surface and the other main surface of the piezoelectric layer 101. The vibration section 104 is placed on (connected to) a substrate 105 via a support section 109. A gap between the substrate 105 and the lower electrode 102 acts as a cavity 106.

The piezoelectric layer 101 is formed of a piezoelectric material such as, for example, aluminum nitride (AlN), zinc oxide (ZnO), a lead zirconate titanate (PZT)-system material, lithium niobate (LiNbO$_3$), lithium tantalate (LITaO$_3$) or potassium niobate (KNbO$_3$). The lower electrode 102, the upper electrode 103, the input/output electrodes 107, and the line electrodes 108 are formed of a conductive material such as, for example, molybdenum (Mo), aluminum (Al), tungsten (W), platinum (Pt), gold (Au), silver (Ag), titanium (Ti) or copper (Cu), a layered metal thereof or an alloy thereof. From the viewpoint of the production process, it is desirable to form the input/output electrodes 107 and the line electrodes 108 of the same material as that of the lower electrode 102 and the upper electrode 103.

The substrate 105 is formed of silicon (Si), gallium arsenide (GaAs), glass, sapphire or the like. The support section 109 is formed of a conductive material such as, for example, titanium, gold, tin (Sn), chromium (Cr), or an alloy such as gold tin (AuSn) or gold silicon (AuSi), because the piezoelectric resonator is produced by a method having a feature described later. These conductive materials maybe used independently or in a multi-layer structure. The support section 109 may be formed of a conductive bump.

One feature of the piezoelectric resonator according to the present invention is that the support section 109 is provided on an area of the piezoelectric layer 101 excluding the area having the vibration section 104 provided thereon and the area having the input/output electrodes 107 and the line electrodes 108 provided thereon. Namely, the support section 109 is provided at a position which does not overlap any electrode in the vertical projection direction.

Figure 2A:
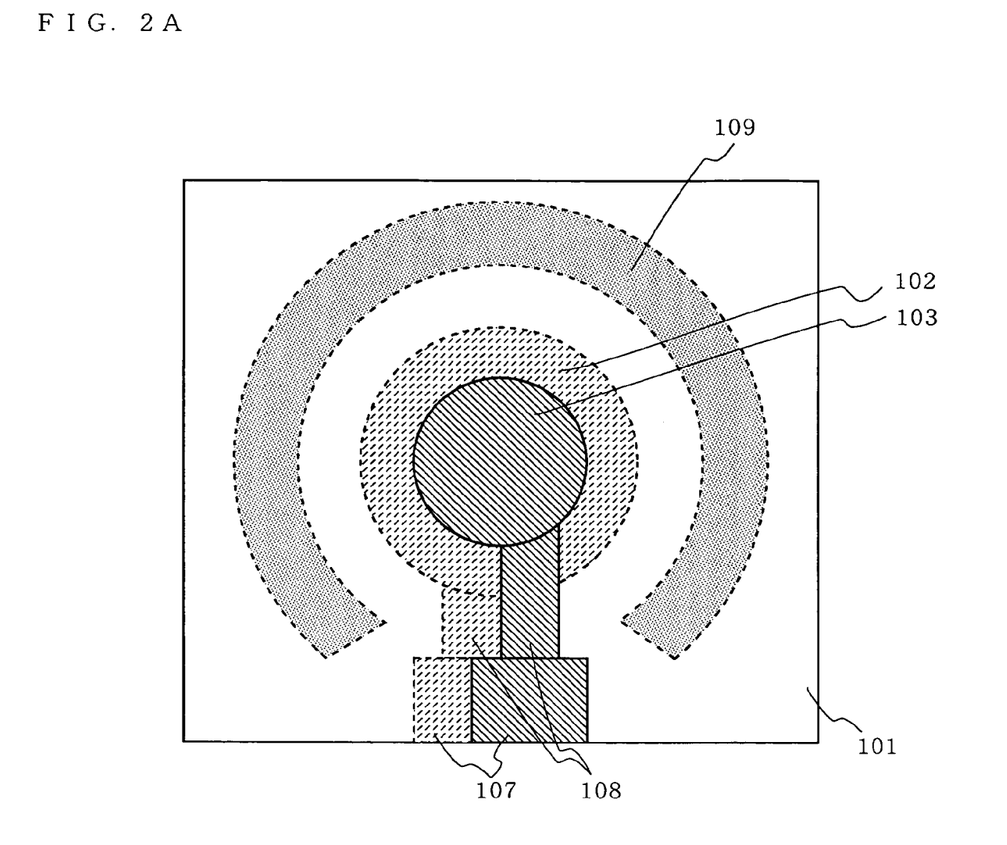
FIG. 2A through FIG. 2C schematically show structures of piezoelectric resonators according to other embodiments of the present invention.
Figure 2B:
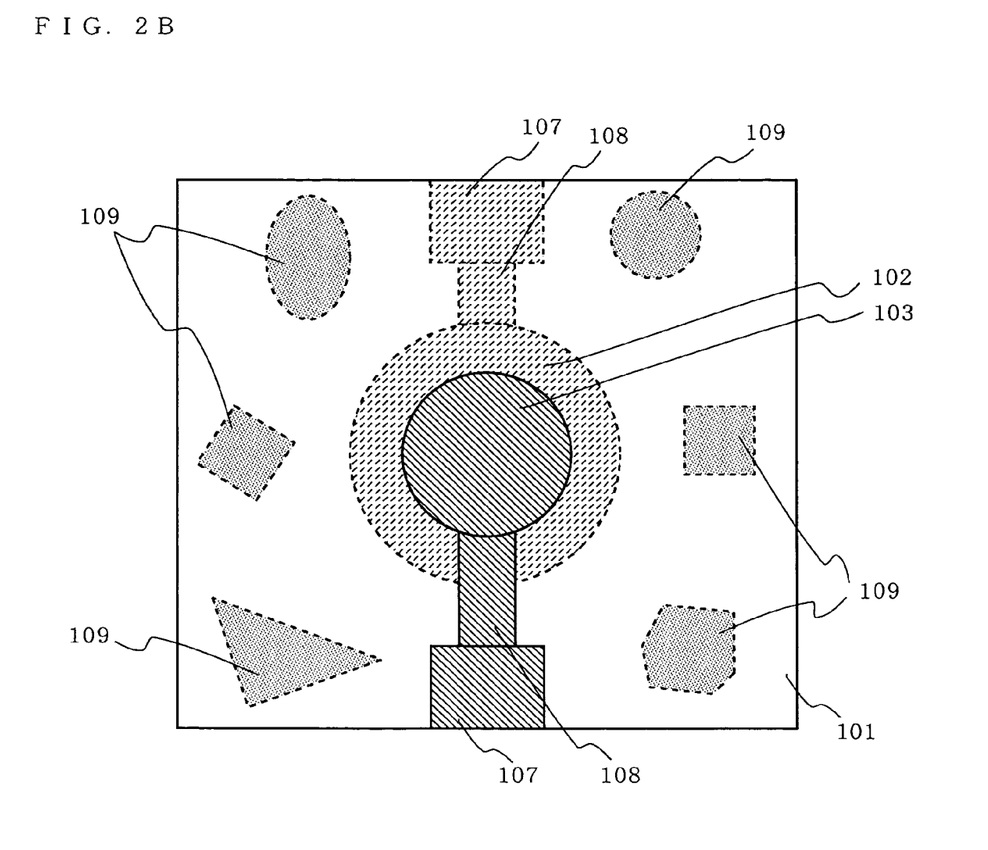
Figure 2C:
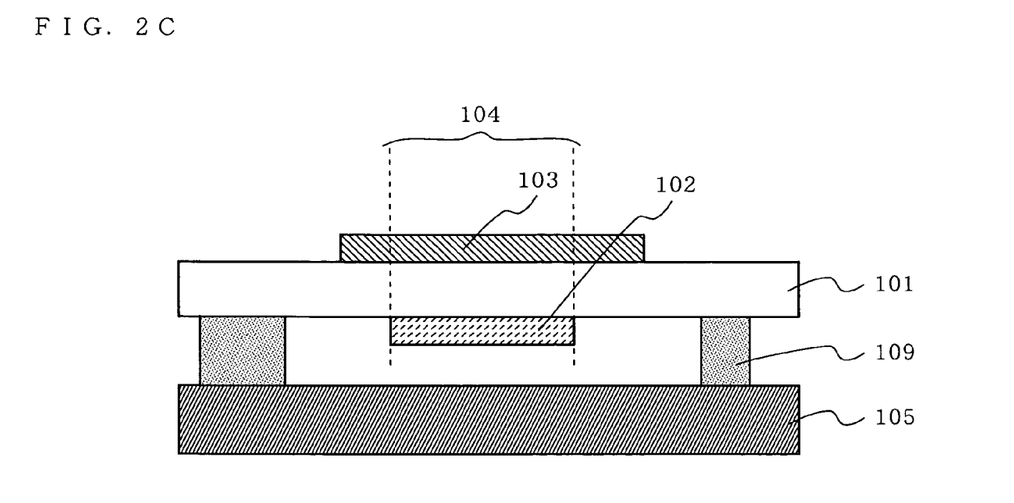

As shown in FIG. 2A through FIG. 2C, as long as this feature is fulfilled, the support section 109 maybe freely designed in terms of, for example, the number of support columns included therein, the cross-sectional shape, and the positional and size relationship with the upper electrode 103 and the lower electrode 102.

In order to suppress the unnecessary vibration leaking from the piezoelectric resonator to the substrate 105, it is preferable to form the support section 109 in such a shape and at such a position that the support section 109 is not rotation-symmetrical with respect to the vibration center of the vibration section 104 and/or such that the support section 109 is not line-symmetrical with respect to a straight line passing through the vibration center of the vibration section 104. As shown in FIG. 1B, it is preferable that the maximum straight distance α between an outer circumferential edge of the lower electrode 102 and the support section 109 is larger than the maximum straight distance β between an outer circumferential edge of the upper electrode 103 and the outer circumferential edge of the lower electrode 102. With such a structure, the capacitance component which is generated between the lower electrode 102/the upper electrode 103 and the support section 109 can be minimized.

(Method for Producing the Piezoelectric Resonator)

Figure 3A:
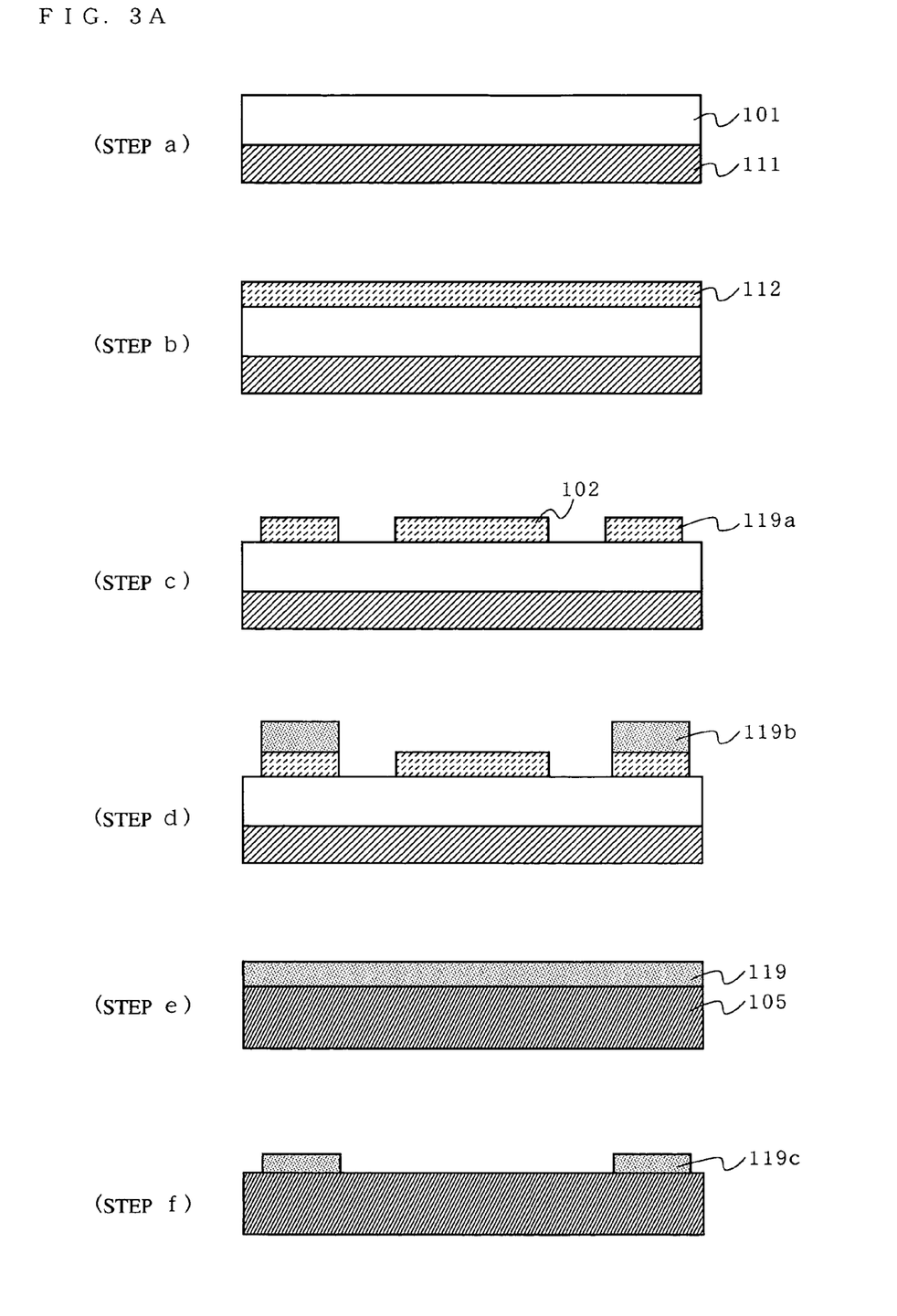
FIG. 3A and FIG. 3B schematically show a method for producing the piezoelectric resonator shown in FIG. 1B.
Figure 3B:
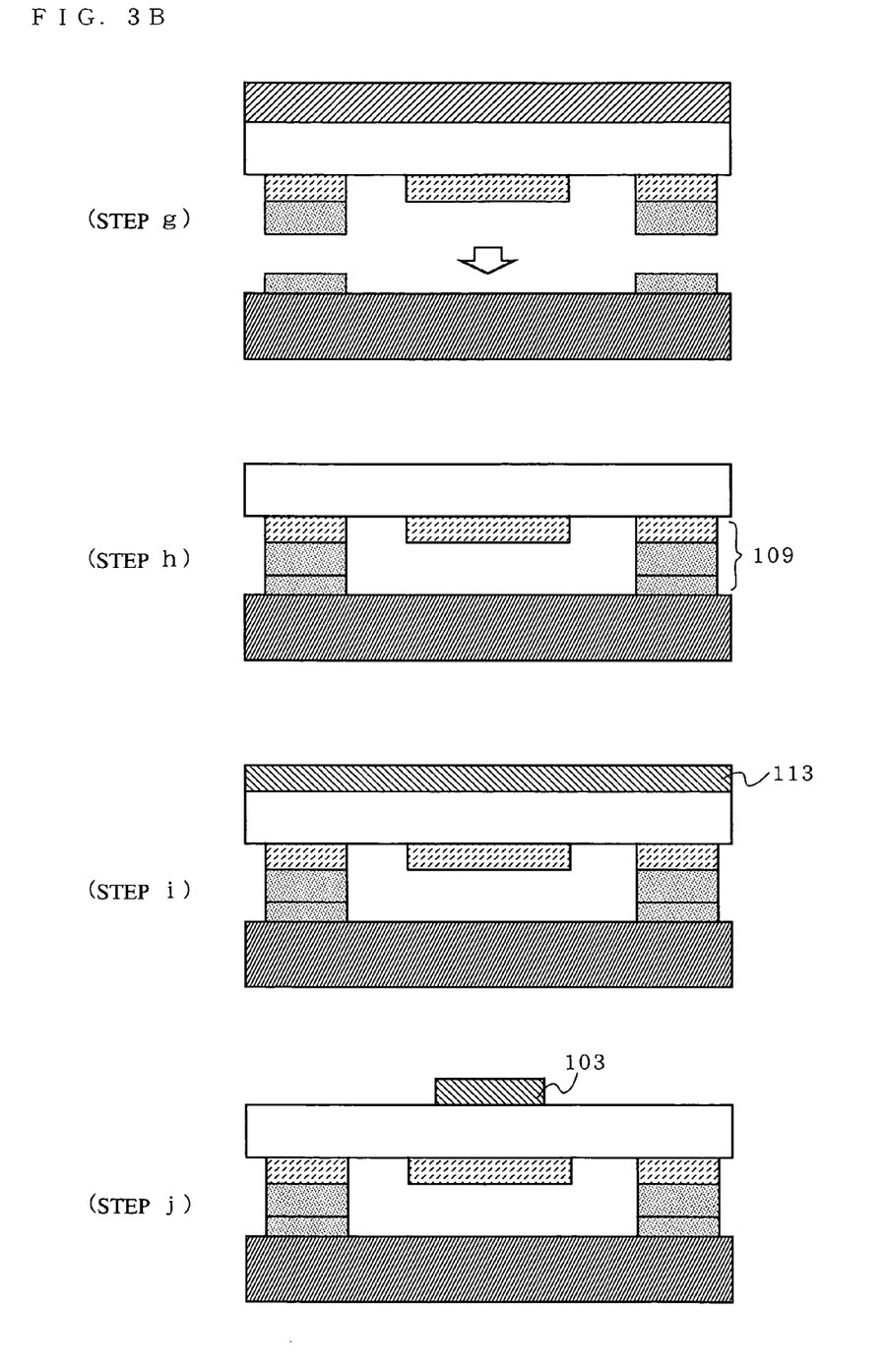

FIG. 3A and FIG. 3B schematically show a method for producing the piezoelectric resonator according to this embodiment. By this method, the piezoelectric resonator shown in FIG. 1A and FIG. 1B is produced using a wafer-to-wafer bonding method.

First, a layer-forming substrate 111 formed of silicon, glass, sapphire or the like is prepared. On the layer-forming substrate 111, an insulating film (not shown) formed of a thermal oxide film, anitride film or the like is formed. On the insulating film, the piezoelectric layer 101 is formed (FIG. 3A, step a). Next, on the piezoelectric layer 101, an electrode film 112 to be the lower electrode 102 is formed (FIG. 3A, step b). The piezoelectric layer 101 and the electrode film 112 need to be adjusted to have a thickness to obtain a desired resonance frequency in consideration of the thickness of the insulating film. For example, when it is intended to generate a resonance frequency of several gigahertz utilizing the thickness longitudinal vibration of the piezoelectric layer 101, the thickness of the piezoelectric layer 101 is about 1 μm.

Then, the electrode film 112 is patterned by photolithography or lift-off to form the lower electrode 102 and support layers 119a acting as base layers of the support section 109 (FIG. 3A, step c). On the support layers 119a, support layers 119b to be a part of the support section 109 is formed by electron-beam vapor deposition, sputtering or the like (FIG. 3A, step d). The support layers 119a and the support layers 119b may be formed integrally in the case where the support layers 119a and 119b are formed of the same material. By this step, the layer-forming substrate 111 and the elements thereon are ready for bonding.

Then, the substrate 105 which is to support the vibration section 104 is prepared. On the substrate 105, an insulating film (not shown) such as a thermal oxide film, a nitride film or the like is formed. On the insulating film, a conductive layer 119 is formed by electron-beam vapor deposition, sputtering or the like (FIG. 3A, step e). The conductive layer 119 is patterned by photolithography or lift-off to form support layers 119c to be a part of the support section 109 (FIG. 3A, step f). In this example, the support layers 119b and 119c are formed to have a structure of Ti/Au/AuSn by electron-beam vapor deposition, such that when the substrate 105 and the layer-forming substrate 111 face each other, the AuSn alloy layers thereof are in contact with each other. The pattern of the support layers 119c formed on the substrate 105 does not need to be exactly the same as that of the support layers 119b formed on the layer-forming substrate 111. It is preferable to provide some margin in consideration of the positioning precision of the substrates 105 and 111.

Next, the layer-forming substrate 111 and the substrate 105 are positioned such that the support layers 119b of the layer-forming substrate 111 and the support layers 119c of the substrate 105 face each other. The support layers 119b and the support layers 119 care bonded together by eutectic crystallization of gold and tin (FIG. 3B, step g). At this point, the substrates 105 and 111 may be pressurized. By an alternative process, the combined substrates 105 and 111 are heated to put the AuSn layers, which are in contact with each other, into a melted state, and then the temperature is lowered. In this way, a strong metal bond can be obtained. By the above-mentioned bonding step, a piezoelectric resonator having a highly reliable bond can be obtained. For example, the substrates 105 and 111 can be easily bonded together by once melting gold tin at 375° C. and 0.3 MPa and then coagulating the gold tin.

In this example, the AuSn alloy is used for the support section 109. The present invention is not limited to this. For example, in the case where the two substrates are bonded together by once putting the support section 109 into a melted state or a semi-melted state, the melting point (solidus temperature) only needs to be higher than the solder reflow temperature for mounting the piezoelectric resonator to a motherboard and lower than the melting point of the material of the electrodes or the like of the piezoelectric resonator. The support layers 119b and 119c may be bonded together by diffusion bonding using mutual diffusion of metals at a temperature equal to or lower than the melting point thereof, or maybe bonded together at room temperature by activating the bonding surfaces using plasma processing or the like. In the case where the bonding is performed at room temperature, the residual thermal stress of the vibration section can be eliminated. Therefore, a piezoelectric resonator with little time-wise change of frequency or the like can be produced at a high yield.

Next, the layer-forming substrate 111 is removed from the assembly of the two substrates 105 and 111 (FIG. 3B, step h). The layer-forming substrate 111 may be removed by, for example, dry etching. By steps g and h, the elements originally formed on the layer-forming substrate 111 are transferred onto the substrate 105. Then, on the piezoelectric layer 101 from which the layer-forming substrate 111 has been removed, an electrode film 113 to be the upper electrode 103 is formed (FIG. 3B, step i). The electrode film 113 is patterned to form the upper electrode 103 (FIG. 3B, step j). Finally, the input/output electrodes 107 and the line electrodes 108 are formed. Thus, the piezoelectric resonator shown in FIG. 1A and FIG. 1B is completed.

In the above-described production method, the electrode film 113 to be the upper electrode 103 is formed in one of the final steps. Alternatively, the electrode film 113 may be formed on the layer-forming substrate 111 before the piezoelectric layer 101 is formed on the layer-forming substrate 111. In this case, after the layer-forming substrate 111 is removed in step h, the electrode film 113 is patterned to form the upper electrode 103.

As described above, in the piezoelectric resonator according to one embodiment of the present invention, the support section 109 is separated from the vibration section 104. Therefore, the Q value and Δf can be improved. Especially because the support section 109 is located non-rotation-symmetrically or non-line-symmetrically, unnecessary modes in the transverse direction becomes unlikely to occur and thus the unnecessary spurious can be effectively reduced.

(Example of Structures using the Piezoelectric Resonator)

Figure 4:
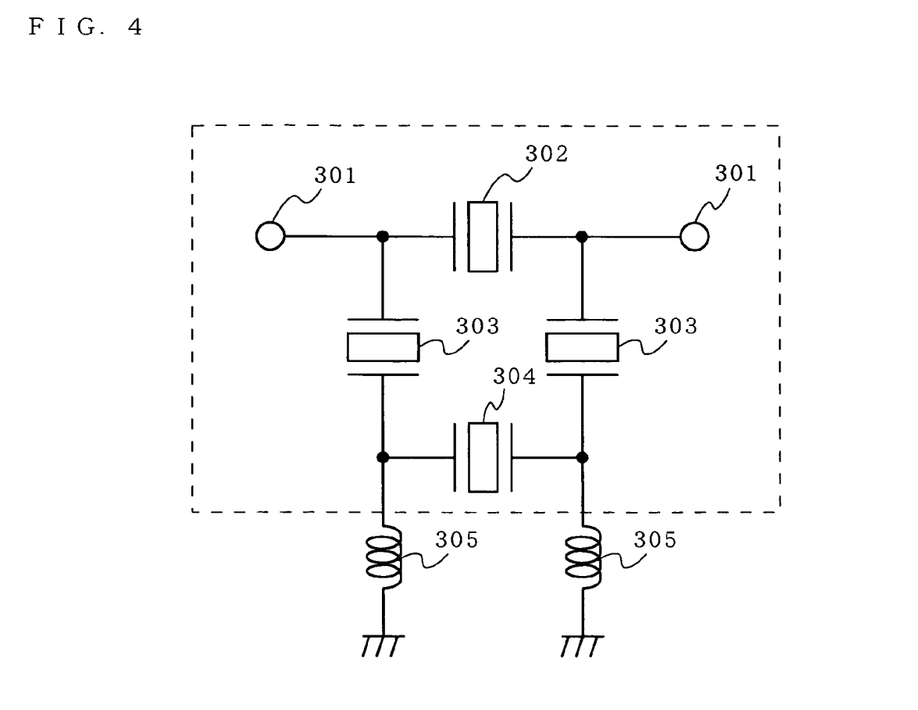
FIG. 4 shows an example of a piezoelectric filter circuit using a piezoelectric resonator according to the present invention.
Figure 5:
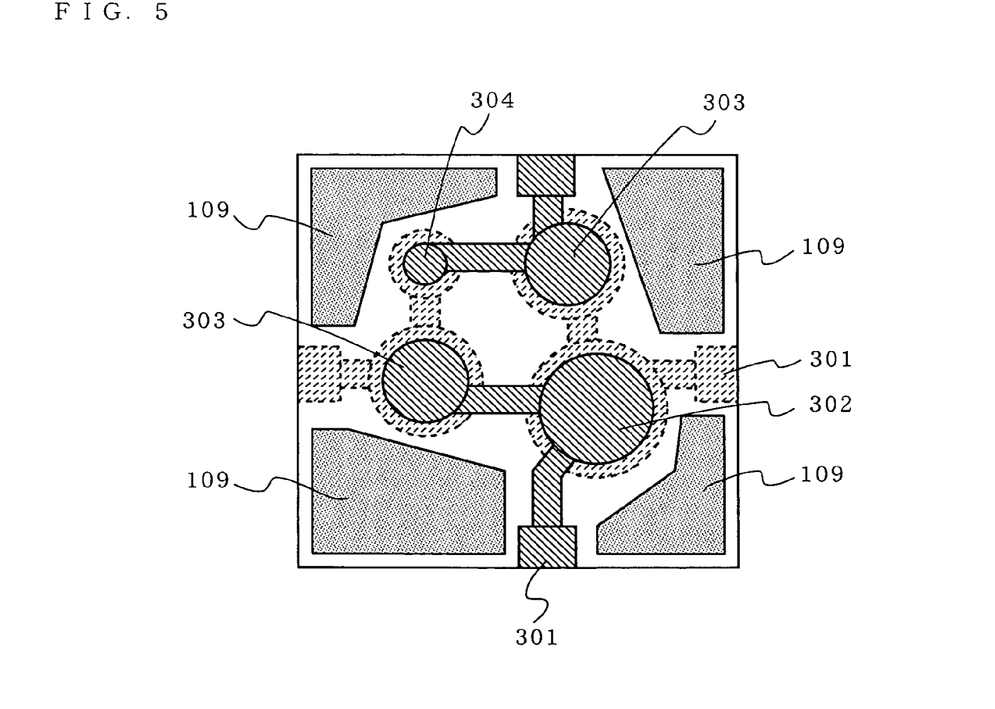
FIG. 5 schematically shows a structure of the piezoelectric filter shown in FIG. 4.

FIG. 4 shows an example of a piezoelectric filter circuit using a piezoelectric resonator according to the present invention. FIG. 5 is a plan view schematically showing a part surrounded by the dashed line in FIG. 4. The piezoelectric filter circuit shown in FIG. 4 and FIG. 5 has the following structure. A series piezoelectric resonator 302 and a bypass piezoelectric resonator 304 inserted in series between input/output terminals 301, and parallel piezoelectric resonators 303 inserted in parallel, are connected in a lattice form. The parallel piezoelectric resonators 303 are grounded via inductors 305.

By substantially matching the resonance frequency of the series piezoelectric resonator 302 and the anti-resonance frequency of the parallel piezoelectric resonators 303, a bandpass characteristic having a pole on the lower side and the higher side of the passband can be realized. By setting the resonance frequency of the bypass piezoelectric resonator 304 to be lower than the resonance frequency of the parallel piezoelectric resonators 303, a significant attenuation can be guaranteed in the stop band without deteriorating the insertion loss characteristic in the passband.

The resonance frequency of a piezoelectric thin film resonator is in inverse proportion to the thickness thereof. Therefore, the resonance frequency of each piezoelectric resonator can be set to a desired value by forming an insulating layer of an oxide or a nitride as a frequency adjusting layer after the upper electrode 103 is formed. Use of such a frequency adjusting process realizes a piezoelectric filter circuit having the above-mentioned bandpass characteristic and also small-loss and wide-range filter characteristics.

The resonator characteristics (Q value, Δf) of the bypass piezoelectric resonator 304 do not significantly influence the filter characteristics. Thus, the vibration section 104 of the bypass piezoelectric resonator 304 may be located to overlap the support section 109 in the vertical projection direction. In this case, a part of the support section 109 can be used as lines and thus the material for the lines can be saved.

Figure 6:
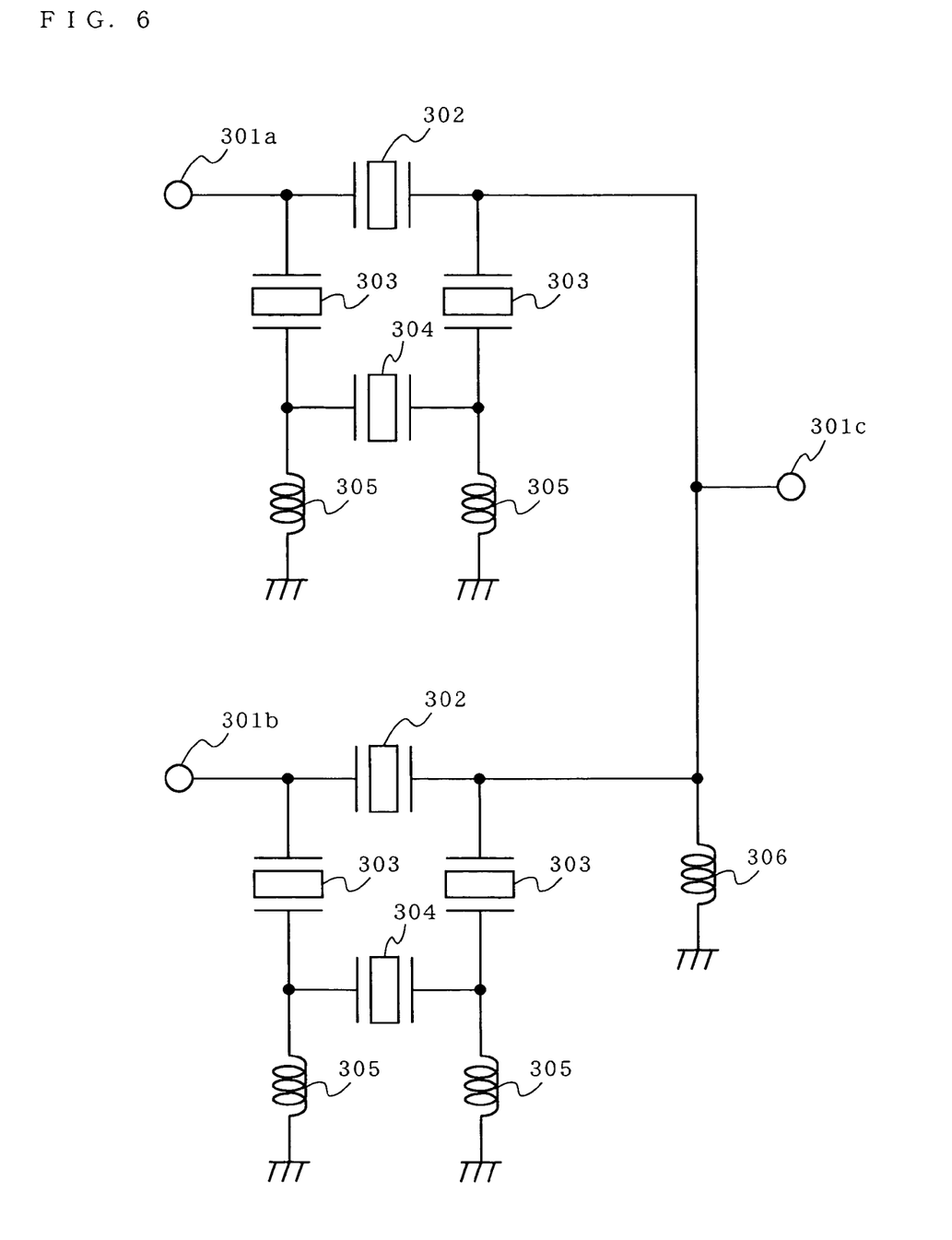
FIG. 6 shows an example of a duplexer using a piezoelectric resonator according to the present invention.

FIG. 6 shows an example of a duplexer using a piezoelectric resonator according to the present invention. The duplexer shown in FIG. 6 includes two piezoelectric filter circuits shown in FIG. 5 connected in series. In this duplexer, an input/output terminal 301a of one of the piezoelectric resonators is used as a transmission terminal, an input/output terminal 301b of the other piezoelectric resonator is used as a receiving terminal, and an input/output terminal 301c at which the piezoelectric resonators are mutually connected is used as an antenna terminal. The input/output terminal 301c is connected to a phase shift inductor 306 as a phase shift circuit.

In this duplexer, the impedance and the phase are adjusted by the phase shift inductor 306, so that the impedance of the transmission path as seen from the input/output terminal 301c is designed to be open in the receiving band and the impedance of the receiving path as seen from the input/output terminal 301c is designed to be open in the transmission band. With such a structure, the isolation between the transmission path and the receiving path can be improved.

Figure 7:
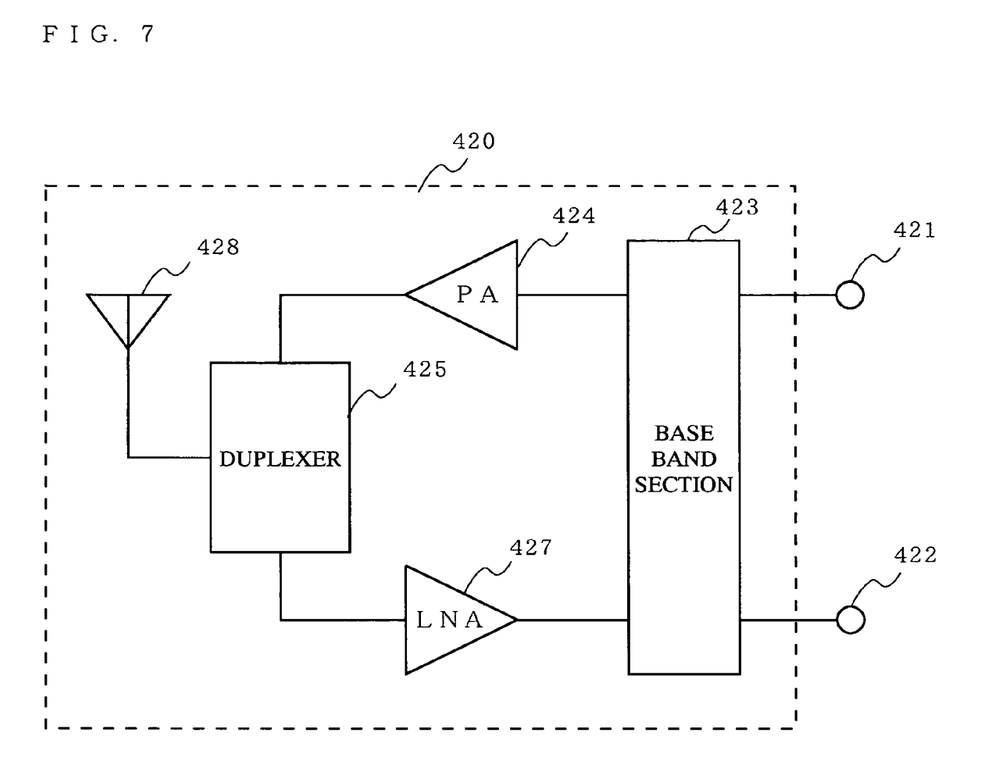
FIG. 7 shows an example of a communication apparatus using a piezoelectric resonator according to the present invention.

FIG. 7 shows an example of a communication apparatus 420 using the duplexer shown in FIG. 6. In the communication apparatus 420 shown in FIG. 7, a signal which is input from a transmission terminal 421 passes through a baseband section 423, is amplified by a power amplifier (PA) 424, is filtered by a duplexer 425, and is transmitted from an antenna 428 as a radio wave. A signal which is received by the antenna 428 is filtered by the duplexer 425, is amplified by a low noise amplifier (LNA) 427, passes through the baseband section 423, and is sent to a receiving terminal 422. With such a structure, a communication apparatus with low power consumption and low noise can be realized.

While the invention has been described in detail, the foregoing description is in all aspects illustrative and not restrictive. It is understood that numerous other modifications and variations can be devised without departing from the scope of the invention.

What is claimed is:

1. A piezoelectric resonator that vibrates at a predetermined frequency, the piezoelectric resonator comprising:
a piezoelectric layer formed of a piezoelectric thin film;
an upper electrode located on a first main surface of the piezoelectric layer;
a lower electrode located on a second main surface of the piezoelectric layer that is opposite the first main surface;
a substrate; and
a support section located between the piezoelectric layer and the substrate,
wherein the support section is located at a position which does not overlap the lower electrode or the upper electrode in a vertical projection direction.

2. A piezoelectric resonator according to claim 1, wherein the support section includes a plurality of support columns.

3. A piezoelectric resonator according to claim 1, wherein an area where the lower electrode, the piezoelectric layer and the upper electrode overlap in the vertical projection direction is a vibration section, and the support section is provided in such a shape and at such a position that the support section is not rotationally-symmetrical with respect to a center of vibration of the vibration section.

4. A piezoelectric resonator according to claim 1, wherein an area where the lower electrode, the piezoelectric layer and the upper electrode overlap in the vertical projection direction is a vibrating section, and the support section is provided in such a shape and at such a position that the support section is not line symmetrical with respect to a straight line passing through a center of vibration of the vibrating section.

5. A piezoelectric resonator according to claim 1, wherein the support section is located at a position at which a maximum straight distance to the lower electrode is larger than a maximum straight distance between an outer circumferential edge of the upper electrode and an outer circumferential edge of the lower electrode.

6. A piezoelectric resonator according to claim 1, wherein the support section is formed of a conductive material.

7. A piezoelectric filter comprising a plurality of piezoelectric resonators, at least one of the piezoelectric resonators being a piezoelectric resonator according to claim 1.

8. A duplexer comprising a transmission filter and a receiving filter, wherein at least one of the transmission filter and the receiving filter includes a piezoelectric filter according to claim 7.

9. A communication apparatus comprising an antenna, a transmission circuit and a receiving circuit, wherein at least one of a common connection section of the antenna and the transmission circuit and the receiving circuit, a transmission circuit, and a receiving circuit includes a duplexer according to claim 8.

10. The piezoelectric resonator according to claim 1, wherein the support section is in contact with the piezoelectric layer.

\* \* \* \* \*